US011237678B2

(12) United States Patent
Hu et al.

(10) Patent No.: US 11,237,678 B2
(45) Date of Patent: Feb. 1, 2022

(54) TOUCH SUBSTRATE HAVING ANTI-REFLECTIVE COATING, DISPLAY APPARATUS, AND FABRICATING METHOD THEREOF

(71) Applicants: BOE TECHNOLOGY GROUP CO., LTD., Beijing (CN); Hefei Xinsheng Optoelectronics Technology Co., Ltd., Anhui (CN)

(72) Inventors: Haifeng Hu, Beijing (CN); Ming Zhang, Beijing (CN); Ting Zeng, Beijing (CN); Liuyue Yin, Beijing (CN); Cui Chen, Beijing (CN); Youting Zhang, Beijing (CN)

(73) Assignees: BOE TECHNOLOGY GROUP CO., LTD., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 847 days.

(21) Appl. No.: 16/067,777

(22) PCT Filed: Dec. 13, 2017

(86) PCT No.: PCT/CN2017/115915
§ 371 (c)(1),
(2) Date: Jul. 2, 2018

(87) PCT Pub. No.: WO2019/006992
PCT Pub. Date: Jan. 10, 2019

(65) Prior Publication Data
US 2021/0208731 A1    Jul. 8, 2021

(30) Foreign Application Priority Data
Jul. 6, 2017 (CN) .......................... 201710546182.6

(51) Int. Cl.
*G06F 3/044* (2006.01)
*G06F 3/041* (2006.01)

(52) U.S. Cl.
CPC .......... *G06F 3/0445* (2019.05); *G06F 3/0412* (2013.01); *G06F 2203/04103* (2013.01)

(58) Field of Classification Search
CPC ........................... G06F 3/0445; G06F 3/0412
(Continued)

(56) References Cited

U.S. PATENT DOCUMENTS 9,933,890 B2 *  4/2018  Kim ................. H05K 1/0298
10,747,372 B2 * 8/2020  Wang .................. B32B 27/308
(Continued)

FOREIGN PATENT DOCUMENTS

CN    103135866 A    6/2013
CN    104360780 A    2/2015
(Continued)

OTHER PUBLICATIONS

First Office Action in the Chinese Patent Application No. 201710546182.6, dated Apr. 14, 2020; English translation attached.
(Continued)

*Primary Examiner* — Calvin C Ma
(74) *Attorney, Agent, or Firm* — Intellectual Valley Law, P.C.

(57) ABSTRACT

The present application discloses a touch substrate. The touch substrate includes a base substrate and a first touch electrode layer on the base substrate and including a plurality of first touch electrodes. Each of the plurality of first touch electrodes has a first side proximal to the base substrate and a second side distal to the base substrate. The touch substrate further includes a first anti-reflective coating on both the first side and the second side of each of the
(Continued)

plurality of first touch electrodes for reducing reflection of light on each of the plurality of first touch electrodes.

20 Claims, 5 Drawing Sheets

(58) Field of Classification Search
 USPC .......................................................... 345/173
 See application file for complete search history.

(56) References Cited

U.S. PATENT DOCUMENTS

| | | | | |
|---|---|---|---|---|
| 2008/0143906 | A1* | 6/2008 | Allemand | B82Y 30/00 |
| | | | | 349/43 |
| 2012/0169400 | A1* | 7/2012 | Liu | G06F 3/04166 |
| | | | | 327/517 |
| 2015/0253910 | A1* | 9/2015 | Lee | G06F 3/0445 |
| | | | | 345/173 |

FOREIGN PATENT DOCUMENTS

| | | |
|---|---|---|
| CN | 104407726 A | 3/2015 |
| CN | 104898878 A | 9/2015 |
| CN | 106201071 A | 12/2016 |
| CN | 106298861 A | 1/2017 |
| CN | 106708322 A | 5/2017 |
| EP | 3287878 A1 | 2/2018 |
| JP | 2007095966 A | 4/2007 |
| JP | 2015118982 A | 6/2015 |
| JP | 2017091309 A | 5/2017 |
| WO | 2016171421 A1 | 10/2016 |

OTHER PUBLICATIONS

International Search Report & Written Opinion dated Mar. 27, 2018, regarding PCT/CN2017/115915.

* cited by examiner

TOUCH SUBSTRATE HAVING ANTI-REFLECTIVE COATING, DISPLAY APPARATUS, AND FABRICATING METHOD THEREOF

CROSS-REFERENCE TO RELATED APPLICATION

This application is a national stage application under 35 U.S.C. § 371 of International Application No. PCT/CN2017/115915, filed Dec. 13, 2017, which claims priority to Chinese Patent Application No. 201710546182.6, filed Jul. 6, 2017, the contents of which are incorporated by reference in the entirety.

TECHNICAL FIELD

The present invention relates to display technology, more particularly, to a touch substrate having anti-reflective coating, a display apparatus, and a fabricating method thereof.

BACKGROUND

In recent years, touch devices have been widely used in many electronic devices such as mobile phones, computer display panels, touch screens, satellite navigation devices. digital cameras, etc. Examples of touch devices include a mutual-capacitance touch control device and a self-capacitance touch control device. In a mutual-capacitance touch control device, the touch electrodes include multiple touch scanning electrodes (Tx) and multiple touch sensing electrodes (Rx). In a self-capacitance touch control device, the touch electrode can achieve touch control function alone. When a finger touches a point on the touch control display panel, the capacitor of the finger superimposes on the touch panel capacitor, resulting in a change in the capacitance of the touch panel capacitor. Based on the capacitance change upon a touch event, the coordinates of the first electrode and the second electrode being touched may be determined. In detecting touch events, the mutual capacitive touch display panel examines the touch scanning electrode array and the touch sensing electrode array sequentially. Touch resolution correlates with the distance between adjacent conductive channels. A smaller distance between adjacent conductive channels results in a higher touch resolution.

SUMMARY

In one aspect, the present invention provides a touch substrate comprising a base substrate; and a first touch electrode layer on the base substrate and comprising a plurality of first touch electrodes; wherein each of the plurality of first touch electrodes has a first side proximal to the base substrate and a second side distal to the base substrate; and the touch substrate further comprises a first anti-reflective coating on both the first side and the second side of each of the plurality of first touch electrodes for reducing reflection of light on each of the plurality of first touch electrodes.

Optionally, the first anti-reflective coating comprises a first anti-reflective layer on the first side of each of the plurality of first touch electrodes; and a second anti-reflective layer on the second side of each of the plurality of first touch electrodes.

Optionally, orthographic projections of the first anti-reflective layer and the second anti-reflective layer on the base substrate substantially cover an orthographic projection of each of the plurality of first touch electrodes.

Optionally, each of the plurality of first touch electrodes further has a third side connecting the first side and the second side; and the second anti-reflective layer covers the third side.

Optionally, the plurality of first touch electrodes comprises a plurality of first nanowire touch electrodes; the first anti-reflective layer comprises a plurality of first anti-reflective nanowires, each of which on a side of one of the plurality of first nanowire touch electrodes proximal to the base substrate; and the second anti-reflective layer comprises a plurality of second anti-reflective nanowires, each of which on a side of one of the plurality of first nanowire touch electrodes distal to the base substrate.

Optionally, each of the plurality of first nanowire touch electrodes has a line width in a range of approximately 0.1 nm to approximately 100 nm.

Optionally, each of the plurality of first nanowire touch electrodes has a thickness in a range of approximately 0.4 m to approximately 400 nm.

Optionally, each of the plurality of first anti-reflective nanowires has a line width in a range of approximately 0.12 nm to approximately 150 nm.

Optionally, each of the plurality of second anti-reflective nanowires has a line width in a range of approximately 0.132 nm to approximately 210 nm.

Optionally, each of the plurality of second anti-reflective nanowires has a second coating thickness over the second side of one of the plurality of first touch electrodes; each of the plurality of first anti-reflective nanowires has a first coating thickness over the first side of one of the plurality of first touch electrodes; and the second coating thickness is smaller than the first coating thickness.

Optionally, the touch substrate further comprises a second touch electrode layer on the base substrate and comprising a plurality of second touch electrodes; wherein each of the plurality of second touch electrodes has a fourth side proximal to the base substrate and a fifth side distal to the base substrate; and the touch substrate further comprises a second anti-reflective coating on both the fourth side and the fifth side of each of the plurality of second touch electrodes for reducing reflection of light on each of the plurality of second touch electrodes.

Optionally, the second anti-reflective coating comprises a third anti-reflective layer on the fourth side of each of the plurality of second touch electrodes; and a fourth anti-reflective layer on the fifth side of each of the plurality of second touch electrodes.

Optionally, orthographic projections of the third anti-reflective layer and the fourth anti-reflective layer on the base substrate substantially cover an orthographic projection of each of the plurality of second touch electrodes.

Optionally, each of the plurality of second touch electrodes further has a sixth side connecting the fourth side and the fifth side; and the second anti-reflective layer covers the sixth side.

Optionally, the plurality of second touch electrodes comprises a plurality of second nanowire touch electrodes; the third anti-reflective layer comprises a plurality of third anti-reflective nanowires, each of which on a side of one of the plurality of second nanowire touch electrodes proximal to the base substrate; and the fourth anti-reflective layer comprises a plurality of fourth anti-reflective nanowires, each of which on a side of one of the plurality of second nanowire touch electrodes distal to the base substrate.

Optionally, each of the plurality of second nanowire touch electrodes has a line width in a range of approximately 0.1 nm to approximately 100 nm.

Optionally, each of the plurality of second nanowire touch electrodes has a thickness in a range of approximately 0.4 nm to approximately 400 nm.

Optionally, each of the plurality of third anti-reflective nanowires has a line width in a range of approximately 0.12 nm to approximately 150 nm.

Optionally, each of the plurality of fourth anti-reflective nanowires has a line width in a range of approximately 0.132 nm to approximately 210 nm.

Optionally, each of the plurality of fourth anti-reflective nanowires has a fourth coating thickness over the fifth side of one of the plurality of second touch electrodes; each of the plurality of third anti-reflective nanowires has a third coating thickness over the fourth side of one of the plurality of second touch electrodes; and the fourth coating thickness is smaller than the third thickness.

Optionally, the plurality of first touch electrodes comprises a plurality of first nanowire touch electrodes, each of which comprises a metallic nanowire.

Optionally, the first anti-reflective coating comprises one or a combination of a metal oxide, a metal nitride, a metal oxynitride, an alloy oxide, an alloy nitride, and an alloy oxynitride.

In another aspect, the present invention provides a touch control display apparatus comprising the touch substrate described herein or fabricated by a method described herein.

In another aspect, the present invention provides a method of fabricating a touch substrate, comprising forming a first touch electrode layer on a base substrate, the first touch electrode layer is formed to comprise a plurality of first touch electrodes; and forming a first anti-reflective coating for reducing reflection of light on each of the plurality of first touch electrodes; wherein each of the plurality of first touch electrodes has a first side proximal to the base substrate and a second side distal to the base substrate; and forming the first anti-reflective coating comprises forming a first anti-reflective layer on the first side of each of the plurality of first touch electrodes, and forming a second anti-reflective layer on the second side of each of the plurality of first touch electrodes.

Optionally, forming the first touch electrode layer comprises dispersing conductive nano-particles in an organic solvent; forming a plurality of nano-droplets of the conductive nano-particles by applying an electric field to the organic solvent; ink-jet printing the plurality of nano-droplets on the base substrate through a nozzle thereby forming a plurality of nanowires; and removing the organic solvent from the plurality of nanowires using a thermal annealing process, during which the conductive nano-particles in the plurality of nanowires sinter into the final touch electrodes.

Optionally, forming the first anti-reflective coating comprises dispersing nano-particles of an anti-reflective material in an organic solvent; forming a plurality of nano-droplets of the nano-particles of the anti-reflective material by applying an electric field to the organic solvent; ink-jet printing the plurality of nano-droplets on the base substrate through a nozzle having thereby forming a plurality of anti-reflective nanowires; and removing the organic solvent from the plurality of anti-reflective nanowires using a thermal annealing process, during which the anti-reflective nano-particles in the plurality of anti-reflective nanowires sinter into the final anti-reflective layer.

Optionally, ink-jet printing the plurality of nano-droplets on the base substrate comprises ink-jet printing the plurality of nano-droplets on the first side of each of the plurality of first touch electrodes using a first nozzle; and ink-jet printing the plurality of nano-droplets on the second side of each of the plurality of first touch electrodes using a second nozzle; wherein the first nozzle has a first diameter; the second nozzle has a second diameter, and the second diameter is approximately 1.5 times the first diameter.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional touch control display apparatuses, indium tin oxide is typically used as the material for making the transparent touch electrodes. Touch electrodes made of indium tin oxide, however, do not provide good touch control performance in large-size display panels due to the relatively large resistivity of indium tin oxide. Accordingly, metallic touch electrodes have been developed as an alternative.

Metallic touch electrodes, however, have relative lower light transmittance. Typically, metallic touch electrodes are made as thin wires. Moreover, metallic touch electrodes have relatively large light reflectivity. To reduce light reflection on the metallic touch electrodes, typically metallic touch electrodes are made to have a multi-layer structure. The multi-layer structure typically includes a metallic sub-layer having a relatively lower light reflectivity on the top, in order to reduce light reflection on the surface of the metallic touch electrodes. Metallic touch electrodes are typically patterned by a lithography process, including deposition of one or more metallic material layers, deposition of a photoresist layer, exposure and development of the photoresist layer, and etching the metallic material layers.

Because the etching rates of the multiple sub-layers of the one or more metallic material layers differ from each other during the etching process, the touch electrodes are prone to defects such as non-uniform line widths, which leads to tailing phenomenon during the touch control display. Due to non-uniform line widths of the multiple sub-layers, the sub-layer on top often does not completely shield the lower sub-layers of the metallic touch electrodes, light reflection on the exposed surface of the lower sub-layers still present a problem. Overall, many problems exist in the conventional touch control display panel.

Accordingly, the present disclosure provides, inter alia, a touch substrate having anti-reflective coating, a display apparatus, and a fabricating method thereof that substantially obviate one or more of the problems due to limitations and disadvantages of the related art. In one aspect, the present disclosure provides a touch substrate. In some embodiments, the touch substrate includes a base substrate and a first touch electrode layer on the base substrate and having a plurality of first touch electrodes. Each of the plurality of first touch electrodes has a first side proximal to the base substrate and a second side distal to the base substrate. Optionally, the touch substrate further includes a first anti-reflective coating on both the first side and the second side of each of the plurality of first touch electrodes for reducing reflection of light on each of the plurality of first touch electrodes.

Figure 1:
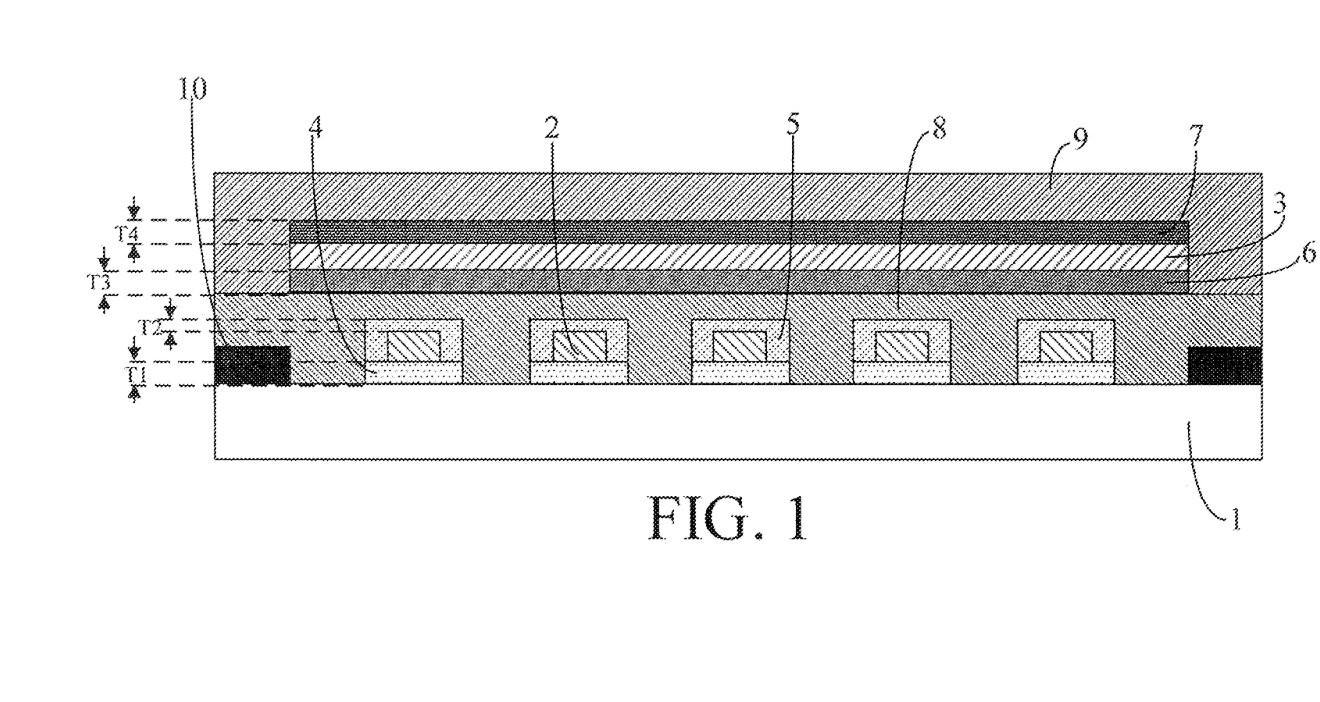
FIG. 1 is a schematic diagram illustrating the structure of a touch substrate in some embodiments according to the present disclosure.

FIG. 1 is a schematic diagram illustrating the structure of a touch substrate in some embodiments according to the present disclosure. Referring to FIG. 1, the touch substrate in some embodiments includes a base substrate 1 and a first touch electrode layer having a plurality of first touch electrode 2 on the base substrate 1.

Figure 2:
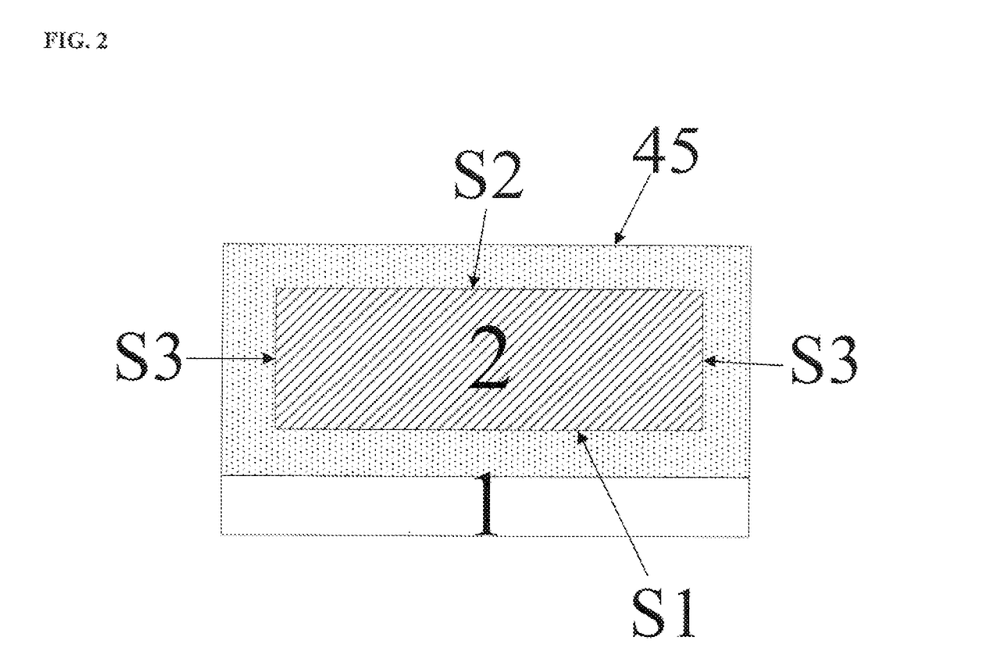
FIG. 2 is a schematic diagram illustrating the structure of a first touch electrode in some embodiments according to the present disclosure.

FIG. 2 is a schematic diagram illustrating the structure of a first touch electrode in some embodiments according to the present disclosure. Referring to FIG. 2, each of the plurality of first touch electrode 2 has a first side S1 proximal to the base substrate 1, a second side S2 distal to the base substrate 1, and a third side S3 connecting the first side S1 and the second side S2. In some embodiments, the touch substrate further includes a first anti-reflective coating 45 for reducing reflection of light on each of the plurality of first touch electrodes 2. Optionally, the first anti-reflective coating 45 is on both the first side S1 and the second side S2 of each of the plurality of first touch electrodes 2. Optionally, the first anti-reflective coating 45 wraps around each of the plurality of first touch electrode 2, e.g., the first anti-reflective coating 45 is on the first side S1, the second side S2, and the third side S3 of each of the plurality of first touch electrode 2.

Referring to FIG. 1 and FIG. 2, the first anti-reflective coating 45 in some embodiments includes a first anti-reflective layer 4 on the first side S1 of each of the plurality of first touch electrodes 2 and a second anti-reflective layer 5 on the second side S2 of each of the plurality of first touch electrodes 2. Optionally, orthographic projections of the first anti-reflective layer 4 and the second anti-reflective layer 5 on the base substrate 1 substantially cover an orthographic projection of each of the plurality of first touch electrodes 2. Optionally, the second anti-reflective layer 5 covers the third side S3 so that all three sides of each of the plurality of first touch electrodes 2 are wrapped by an anti-reflective coating material.

In some embodiments, the plurality of first touch electrodes 2 include a plurality of first nanowire touch electrodes, each of the plurality of first nanowire touch electrodes includes a nanowire, e.g., a metallic nanowire. Optionally, the first anti-reflective layer 4 includes a plurality of first anti-reflective nanowires, each of which on a side (e.g., the first side S1) of one of the plurality of first nanowire touch electrodes proximal to the base substrate 1. Optionally, the second anti-reflective layer 5 includes a plurality of second anti-reflective nanowires, each of which on a side (e.g., the second side S2) of one of the plurality of first nanowire touch electrodes distal to the base substrate 1.

Optionally, each of the plurality of first nanowire touch electrodes has a line width in a range of approximately 0.1 nm to approximately 100 nm, e.g., approximately 0.1 nm to approximately 1 nm, approximately 1 nm to approximately 10 nm, approximately 10 nm to approximately 20 nm, approximately 20 nm to approximately 40 nm, approximately 40 nm to approximately 60 nm, approximately 60 nm to approximately 80 nm, and approximately 80 nm to approximately 100 nm.

Optionally, each of the plurality of first anti-reflective nanowires has a line width in a range of approximately 0.12 nm to approximately 150 nm, e.g., approximately 0.12 nm to approximately 1 nm, approximately 1 nm to approximately 10 nm, approximately 10 nm to approximately 30 nm, approximately 30 nm to approximately 60 nm, approximately 60 nm to approximately 90 nm, approximately 90 nm to approximately 120 nm, and approximately 120 nm to approximately 150 nm.

Optionally, each of the plurality of second anti-reflective nanowires has a line width in a range of approximately 0.132 nm to approximately 210 nm, e.g., approximately 0.132 nm to approximately 1 nm, approximately 1 nm to approximately 10 nm, approximately 10 nm to approximately 40 nm, approximately 40 nm to approximately 80 nm, approximately 80 nm to approximately 120 nm, approximately 120 nm to approximately 160 nm, and approximately 160 nm to approximately 210 nm.

Optionally, each of the plurality of first nanowire touch electrodes has a thickness in a range of approximately 0.4 nm to approximately 400 nm. e.g., approximately 0.4 nm to approximately 1 nm, approximately 1 nm to approximately 10 nm, approximately 10 nm to approximately 50 nm, approximately 50 nm to approximately 100 nm, approximately 100 nm to approximately 200 nm, approximately 200 nm to approximately 300 nm, and approximately 300 nm to approximately 400 nm.

Referring to FIG. 1, in some embodiments, the second anti-reflective layer 5 (e.g., each of the plurality of second anti-reflective nanowires) has a second coating thickness T2 over the second side S2 of one of the plurality of first touch electrodes 2. The first anti-reflective layer 4 (e.g., each of the plurality of first anti-reflective nanowires) has a first coating thickness T1 over the first side S1 of one of the plurality of first touch electrodes 2. Optionally, the second coating thickness T2 is smaller than the first coating thickness T1.

Figure 3:
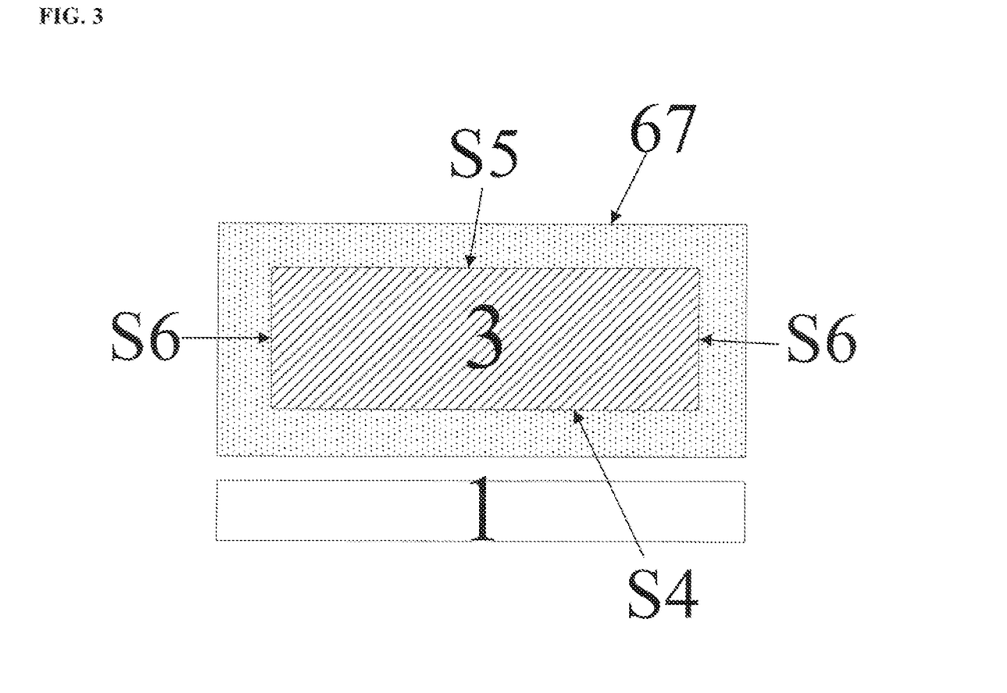
FIG. 3 is a schematic diagram illustrating the structure of a second touch electrode in some embodiments according to the present disclosure.

Referring to FIG. 1, the touch substrate in some embodiments further includes a second touch electrode layer having a plurality of second touch electrode 3 on the base substrate 1. FIG. 3 is a schematic diagram illustrating the structure of a second touch electrode in some embodiments according to the present disclosure. Referring to FIG. 3, each of the plurality of second touch electrode 3 has a fourth side S4 proximal to the base substrate 1, a fifth side S5 distal to the base substrate 1, and a sixth side S6 connecting the fourth side S4 and the fifth side S5. In some embodiments, the touch substrate further includes a second anti-reflective coating 67 for reducing reflection of light on each of the plurality of second touch electrodes 3. Optionally, the second anti-reflective coating 67 is on both the fourth side S4 and the fifth side S5 of each of the plurality of second touch electrodes 3. Optionally, the second anti-reflective coating 67 wraps around each of the plurality of second touch electrode 3, e.g., the second anti-reflective coating 67 is on the fourth side S4, the fifth side S5, and the sixth side S6 of each of the plurality of second touch electrode 3.

Referring to FIG. 1 and FIG. 3, the second anti-reflective coating 67 in some embodiments includes a third anti-reflective layer 6 on the fourth side S4 of each of the plurality of second touch electrodes 3 and a fourth anti-reflective layer 7 on the fifth side S5 of each of the plurality of second touch electrodes 3. Optionally, orthographic projections of the third anti-reflective layer 6 and the fourth anti-reflective layer 7 on the base substrate 1 substantially cover an orthographic projection of each of the plurality of second touch electrodes 3. Optionally, the fourth anti-reflective layer 7 covers the sixth side S6 so that all three sides of each of the plurality of second touch electrodes 3 are wrapped by an anti-reflective coating material.

In some embodiments, the plurality of second touch electrodes 3 include a plurality of second nanowire touch electrodes, each of the plurality of second nanowire touch electrodes includes a nanowire, e.g., a metallic nanowire. Optionally, the third anti-reflective layer 6 includes a plurality of third anti-reflective nanowires, each of which on a side (e.g., the fourth side S4) of one of the plurality of second nanowire touch electrodes proximal to the base substrate 1. Optionally, the fourth anti-reflective layer 7 includes a plurality of fourth anti-reflective nanowires, each of which on a side (e.g., the fifth side S5) of one of the plurality of second nanowire touch electrodes distal to the base substrate 1.

Optionally, each of the plurality of second nanowire touch electrodes has a line width in a range of approximately 0.1 nm to approximately 100 nm, e.g., approximately 0.1 nm to approximately 1 nm, approximately 1 nm to approximately 10 nm, approximately 10 nm to approximately 20 nm, approximately 20 nm to approximately 40 nm, approximately 40 nm to approximately 60 nm, approximately 60 nm to approximately 80 nm, and approximately 80 nm to approximately 100 nm.

Optionally, each of the plurality of third anti-reflective nanowires has a line width in a range of approximately 0.12 nm to approximately 150 nm, e.g., approximately 0.12 nm to approximately 1 nm, approximately 1 nm to approximately 10 nm, approximately 10 nm to approximately 30 nm, approximately 30 nm to approximately 60 nm, approximately 60 nm to approximately 90 nm, approximately 90 nm to approximately 120 nm, and approximately 120 nm to approximately 150 nm.

Optionally, each of the plurality of fourth anti-reflective nanowires has a line width in a range of approximately 0.132 nm to approximately 210 nm, e.g., approximately 0.132 nm to approximately 1 nm, approximately 1 nm to approximately 10 nm, approximately 10 nm to approximately 40 nm, approximately 40 nm to approximately 80 nm, approximately 80 nm to approximately 120 nm, approximately 120 nm to approximately 160 nm, and approximately 160 nm to approximately 210 nm.

Optionally, each of the plurality of second nanowire touch electrodes has a thickness in a range of approximately 0.4 nm to approximately 400 nm, e.g., approximately 0.4 nm to approximately 1 nm, approximately 1 nm to approximately 10 nm, approximately 10 nm to approximately 50 nm, approximately 50 nm to approximately 100 nm, approximately 100 nm to approximately 200 nm, approximately 200 nm to approximately 300 nm, and approximately 300 nm to approximately 400 nm.

Referring to FIG. 1, in some embodiments, the fourth anti-reflective layer 7 (e.g., each of the plurality of fourth anti-reflective nanowires) has a fourth coating thickness T4 over the fifth side S5 of one of the plurality of second touch electrodes 3. The third anti-reflective layer 6 (e.g., each of the plurality of third anti-reflective nanowires) has a third coating thickness T3 over the fourth side S4 of one of the plurality of second touch electrodes 3. Optionally, the fourth coating thickness T4 is smaller than the third coating thickness T3.

Referring to FIG. 1, the touch substrate in some embodiments further includes a black matrix layer 10 in a peripheral area of the touch substrate. The first touch electrode layer and the second touch electrode layer are on a same side of the base substrate 1. Optionally, the touch substrate further includes a first insulating layer 8 on a side of the first touch electrode layer distal to the base substrate 1, the first insulating layer 8 insulates the first touch electrode layer and the second touch electrode layer from each other. Optionally, the touch substrate further includes a second insulating layer 9 on a side of the second touch electrode layer distal to the base substrate 1.

Figure 4:
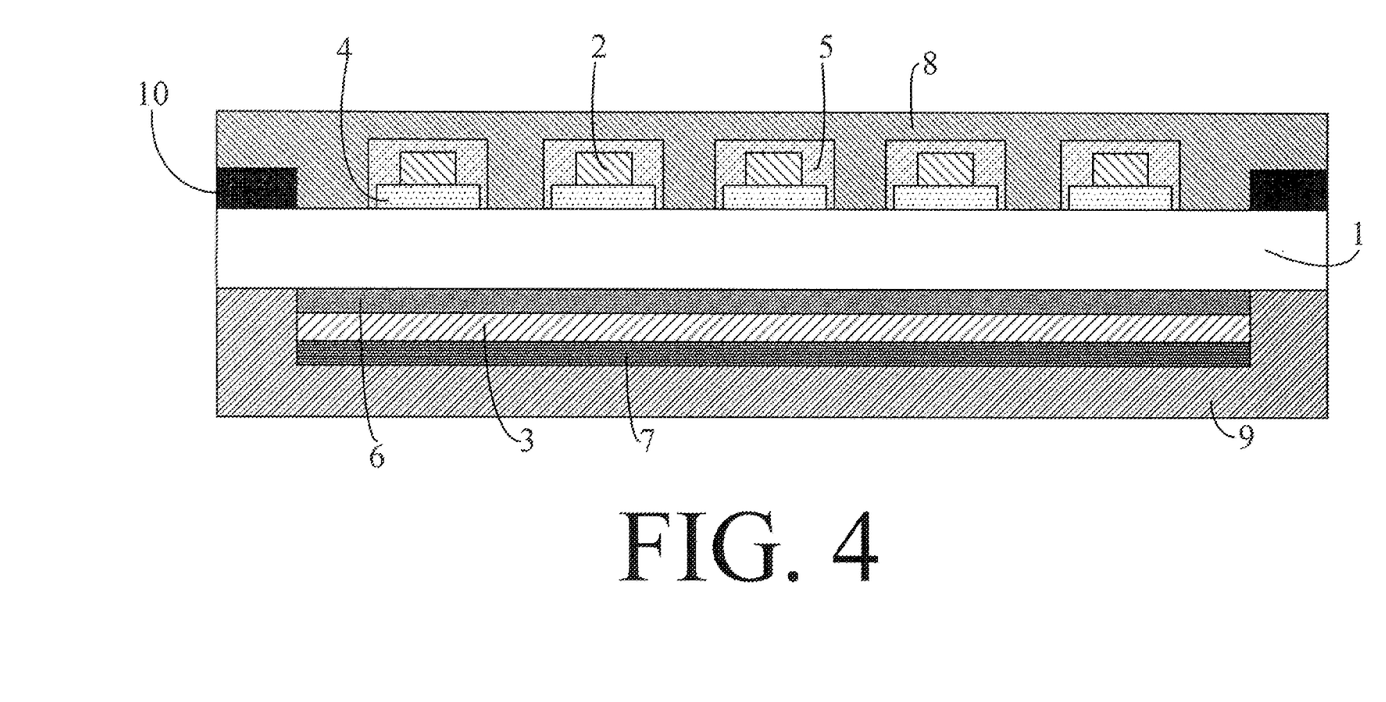
FIG. 4 is a schematic diagram illustrating the structure of a touch substrate in some embodiments according to the present disclosure.

FIG. 4 is a schematic diagram illustrating the structure of a touch substrate in some embodiments according to the present disclosure. Referring to FIG. 4, in some embodiments, the first touch electrode layer and the second touch electrode layer are on two different sides of the base substrate 1. Optionally, the touch substrate further includes a first insulating layer 8 on a side of the first touch electrode layer distal to the base substrate 1. Optionally, the touch substrate further includes a second insulating layer 9 on a side of the second touch electrode layer distal to the base substrate 1.

Optionally, the touch substrate is a self-capacitive touch substrate. Optionally, the touch substrate is a mutual-capacitive touch substrate.

Various appropriate materials may be used for making the first touch electrode layer and the second touch electrode layer. Examples of appropriate conductive materials for making the touch electrodes include a metal, an alloy, a metal oxide, a graphene, carbon nanotubes, and so on. Optionally, the nanowire is a metallic nanowire.

Various appropriate materials may be used for making the anti-reflective coating, e.g., the first anti-reflective coating and the second anti-reflective coating. Examples of appropriate anti-reflective materials include a metal oxide, a metal nitride, a metal oxynitride, an alloy oxide, an alloy nitride, and an alloy oxynitride. Optionally, the anti-reflective coating further includes a small amount of metal or alloy for enhancing adhesion to the touch electrodes.

In another aspect, the present disclosure provides a method of fabricating a touch substrate. In some embodiments, the method includes forming a first touch electrode layer on a base substrate, the first touch electrode layer is formed to include a plurality of first touch electrodes, and forming a first anti-reflective coating for reducing reflection of light on each of the plurality of first touch electrodes. Each of the plurality of first touch electrodes has a first side proximal to the base substrate and a second side distal to the base substrate. Optionally, the first anti-reflective coating is formed on both the first side and the second side of each of the plurality of first touch electrodes.

In some embodiments, the step of forming the first anti-reflective coating includes forming a first anti-reflective layer on the first side of each of the plurality of first touch electrodes, and forming a second anti-reflective layer on the second side of each of the plurality of first touch electrodes. Optionally, the first anti-reflective layer and the second anti-reflective layer are formed so that orthographic projections of the first anti-reflective layer and the second anti-reflective layer on the base substrate substantially cover an orthographic projection of each of the plurality of first touch electrodes. Optionally, each of the plurality of first touch electrodes further has a third side connecting the first side and the second side, and the second anti-reflective layer is formed to cover the third side.

In some embodiments, the step of forming the plurality of first touch electrodes includes a plurality of first nanowire touch electrodes, each of which includes a nanowire, the step of forming the first anti-reflective layer includes forming a plurality of first anti-reflective nanowires, and the step of forming the second anti-reflective layer includes forming a plurality of second anti-reflective nanowires. Optionally, each of the plurality of first anti-reflective nanowires is formed on a side of one of the plurality of first nanowire touch electrodes proximal to the base substrate, e.g., on the first side. Optionally, each of the plurality of second anti-reflective nanowires is formed on a side of one of the plurality of first nanowire touch electrodes distal to the base substrate, e.g., on the second side. Optionally, each of the plurality of second anti-reflective nanowires is formed to have a second coating thickness over the second side S2 of one of the plurality of first touch electrodes 2. Optionally, each of the plurality of first anti-reflective nanowires is formed to have a first coating thickness over the first side S1 of one of the plurality of first touch electrodes 2. Optionally, the second coating thickness is smaller than the first coating thickness.

In some embodiments, the method further includes forming a second touch electrode layer on the base substrate. Optionally, the step of forming the second touch electrode layer includes forming a plurality of second touch electrodes. Each of the plurality of second touch electrodes is formed to have a fourth side proximal to the base substrate and a fifth side distal to the base substrate. Optionally, the method further includes forming a second anti-reflective coating on both the fourth side and the fifth side of each of the plurality of second touch electrodes for reducing reflection of light on each of the plurality of second touch electrodes.

In some embodiments, the step of forming the second anti-reflective coating includes forming a third anti-reflective layer on the fourth side of each of the plurality of second touch electrodes, and forming a fourth anti-reflective layer on the fifth side of each of the plurality of second touch electrodes. Optionally, the third anti-reflective layer and the fourth anti-reflective layer are formed so that orthographic projections of the third anti-reflective layer and the fourth anti-reflective layer on the base substrate substantially cover an orthographic projection of each of the plurality of second touch electrodes. Optionally, each of the plurality of second touch electrodes further has a sixth side connecting the fourth side and the fifth side, and the second anti-reflective layer is formed to cover the sixth side.

In some embodiments, the step of forming the plurality of second touch electrodes includes forming a plurality of second nanowire touch electrodes, each of which includes a nanowire, the step of forming the third anti-reflective layer includes forming a plurality of third anti-reflective nanowires, and the step of forming the fourth anti-reflective layer includes forming a plurality of fourth anti-reflective nanowires. Optionally, each of the plurality of third anti-reflective nanowires is formed on a side of one of the plurality of second nanowire touch electrodes proximal to the base substrate. Optionally, each of the plurality of fourth anti-reflective nanowires is formed on a side of one of the plurality of second nanowire touch electrodes distal to the base substrate. Optionally, each of the plurality of fourth anti-reflective nanowires is formed to have a fourth coating thickness over the fifth side S5 of one of the plurality of second touch electrodes 3. Optionally, each of the plurality of third anti-reflective nanowires is formed to have a third coating thickness over the fourth side S4 of one of the plurality of second touch electrodes 3. Optionally, the fourth coating thickness is smaller than the third thickness.

Figure 5A:
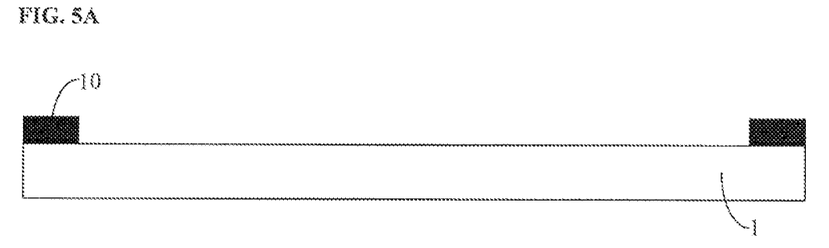
FIGS. 5A to 5H illustrate a process of fabricating a touch substrate in some embodiments according to the present disclosure.

FIGS. 5A to 5H illustrate a process of fabricating a touch substrate in some embodiments according to the present disclosure. Referring to FIG. 5A, a black matrix layer 10 is formed in a peripheral area of the touch substrate. Various appropriate methods may be used for making the black matrix layer 10, e.g., using a lithography process. Optionally, the black matrix layer 10 is formed by ink-jet printing a black material. Optionally, the black matrix layer 10 may be formed using a nozzle having a diameter of approximately 1 mm.

Figure 5B:
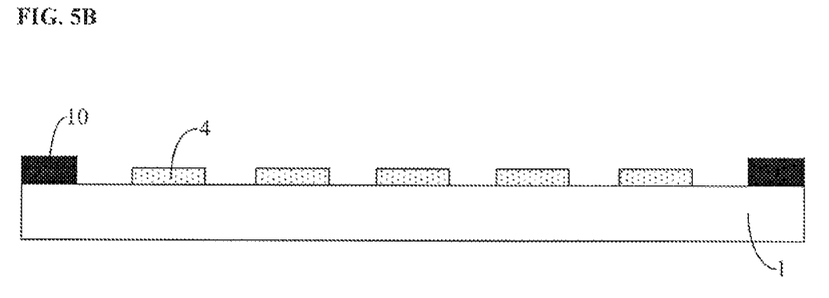

Referring to FIG. 5B, a first anti-reflective layer 4 is formed on the base substrate 1. Various appropriate methods may be used for making the first anti-reflective layer 4, e.g., using a lithography process. Optionally the first anti-reflective layer 4 is formed by ink-jet printing an anti-reflective material.

Figure 5C:
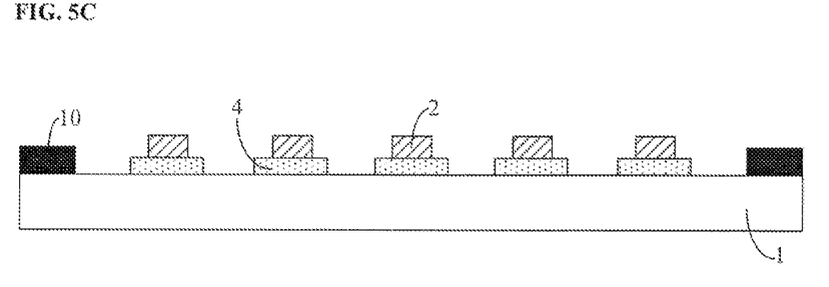

Referring to FIG. 5C, a first touch electrode layer is formed on a side of the first anti-reflective layer 4 distal to the base substrate 1. The step of forming the first touch electrode layer includes forming a plurality of first touch electrodes 2. Various appropriate methods may be used for making the plurality of first touch electrodes 2, e.g., using a lithography process. Optionally, the plurality of first touch electrodes 2 are formed by ink-jet printing a conductive material. Optionally, the ink-jet printing is a nano-printing process, e.g., an electrohydrodynamic inkjet (E-jet) printing process. By forming the plurality of first touch electrodes 2 using a nano-printing process, the touch electrodes may be formed to have a substantially uniform width, thereby obviating tailing phenomenon during the touch control display and enhancing display quality and touch control performance. Touch electrodes formed by a nano-printing process also have better blanking effect and conductivity, further enhancing touch control and display performance of a touch control display panel having the present touch substrate, particularly a large-size touch control display panel.

In some embodiments, the step of ink-jet printing the plurality of first touch electrodes 2 includes dispersing conductive nano-particles (e.g., metallic nano-particles) in an organic solvent, forming a plurality of nano-droplets by applying an electric field to the organic solvent, ink-jet printing the plurality of nano-droplets on a substrate through a nozzle having a small diameter (e.g., 1 μm) thereby forming a plurality of nanowires, and removing the organic solvent from the plurality of nanowires using a thermal annealing process, during which the conductive nano-particles in the plurality of nanowires sinter into the final touch electrodes. In one example, the conductive nano-particles are one or a combination of gold nano-particles, silver nano-particles, and copper nano-particles. Optionally, the thermal annealing process is performed at an annealing temperature in a range of approximately 100 degrees to approximately 350 degrees and for an annealing duration in a range of approximately 1 minute to approximately 60 minutes.

Optionally, the first touch electrode layer has a single layer structure. Optionally, the first touch electrode layer is formed to have a multi-layer structure, e.g., a laminated multi-layer structure. The multiple layers of the first touch electrode layer may be made of a same material. Optionally, at least two layers of the multiple layers of the first touch electrode layer are made of different materials.

Figure 5D:
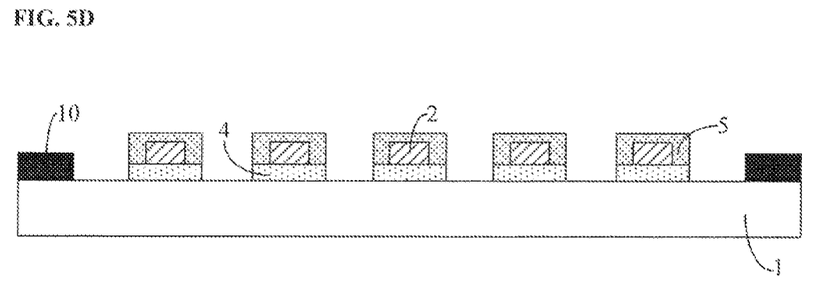

Referring to FIG. 5D, a second anti-reflective layer 5 is formed on a side of the first touch electrode layer distal to the base substrate 1. Various appropriate methods may be used for making the second anti-reflective layer 5, e.g., using a lithography process. Optionally the second anti-reflective layer 5 is formed by ink-jet printing an anti-reflective material. Optionally, the first anti-reflective layer 4 and the second anti-reflective layer 5 are formed so that orthographic projections of the first anti-reflective layer 4 and the second anti-reflective layer 5 on the base substrate 1 substantially cover an orthographic projection of each of the plurality of first touch electrodes 2. By having this design, the reflection of light on each of the plurality of first touch electrodes 2 can be significantly reduced, enhancing the blanking effect of the plurality of first touch electrodes 2.

Various appropriate methods may be used for making the first anti-reflective layer 4 and the second anti-reflective layer 5, e.g., using a lithography process. Optionally, the first anti-reflective layer 4 and the second anti-reflective layer 5 are formed by ink-jet printing an anti-reflective material. Optionally, the ink-jet printing is a nano-printing process, e.g., an electrohydrodynamic inkjet (E-jet) printing process. By forming the first anti-reflective layer 4 and the second anti-reflective layer 5 using a nano-printing process, damages to the plurality of first touch electrodes 2 occurring in an etch process typically associated with a lithography process can be completely avoided, ensuring a substantially uniform line width of the plurality of first touch electrodes 2.

In some embodiments, the step of ink-jet printing the first anti-reflective layer 4 or the second anti-reflective layer 5 includes dispersing nano-particles of an anti-reflective material (e.g., nano-particles of an oxide, a nitride, an oxynitride) in an organic solvent. Optionally, the dispersing step includes dispersing nano-particles of the anti-reflective material and a small amount of metallic nano-particles together in the organic solvent. The step of ink-jet printing the first anti-reflective layer 4 or the second anti-reflective layer 5 further includes forming a plurality of nano-droplets by applying an electric field to the organic solvent, ink-jet printing the plurality of nano-droplets on a substrate through a nozzle having a small diameter (e.g., 2 μm or 3 μm) thereby forming a plurality of anti-reflective nanowires, and removing the organic solvent from the plurality of anti-reflective nanowires using a thermal annealing process, during which the anti-reflective nano-particles in the plurality of anti-reflective nanowires sinter into the final anti-reflective layer. In one example, the anti-reflective nano-particles are nano-particles of one or a combination of an oxide, a nitride, an oxynitride, e.g., nano-particles of one or a combination of a metal oxide, a metal nitride, a metal oxynitride, an alloy oxide, an alloy nitride, and an alloy oxynitride. Optionally, the thermal annealing process is performed at an annealing temperature in a range of approximately 100 degrees to approximately 350 degrees and for an annealing duration in a range of approximately 1 minute to approximately 60 minutes.

Optionally, the step of ink-jet printing the plurality of nano-droplets on the base substrate includes ink-jet printing the plurality of nano-droplets on the first side of each of the plurality of first touch electrodes using a first nozzle; and ink-jet printing the plurality of nano-droplets on the second side of each of the plurality of first touch electrodes using a second nozzle. Optionally, the first nozzle and the second nozzle are a same nozzle. Optionally, the first nozzle has a first diameter; the second nozzle has a second diameter; and a ratio of the second diameter to the first diameter is in a range of approximately 2 to approximately 0.9. Optionally, the second diameter is approximately 1.5 times the first diameter. Optionally, the second diameter is substantially the same as the first diameter. Optionally, the second diameter is 3 μm, and the first diameter is 2 μm.

Inclusion of a small amount of metallic nano-particles together with the nano-particles of the anti-reflective material in the organic solvent facilitates the process of forming the plurality of nano-droplets upon application of the electric field. Because the amount of metallic nano-particles is kept very low, the presence of metallic nano-particles in the anti-reflective layer would not affect the anti-reflective property and insulating property of the anti-reflective layer.

In some embodiments, the anti-reflective material nano-particles solution for printing the second anti-reflective layer 5 has a concentration of the anti-reflective nano-particles lower than the concentration in the solution for printing the first anti-reflective layer 4, e.g., lower by 10% to 40%. As a result, the second anti-reflective layer 5 is formed to have a second coating thickness over the second side S2 of one of the plurality of first touch electrodes 2, the first anti-reflective layer 4 is formed to have a first coating thickness over the first side S1 of one of the plurality of first touch electrodes 2, the second coating thickness being smaller than the first coating thickness, achieving an enhanced anti-reflective result.

Figure 5E:
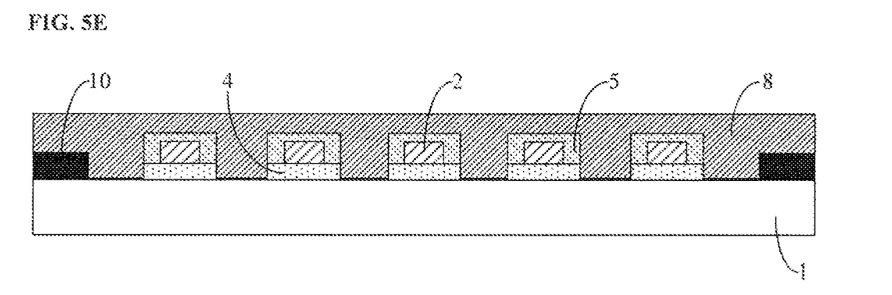

Referring to FIG. 5E, a first insulating layer 8 is formed on a side of the second anti-reflective layer 5 distal to the base substrate 1. Optionally, the first insulating layer 8 includes an organic insulating material. Optionally, the first insulating layer 8 covers the entire surface of the base substrate 1.

Figure 5F:
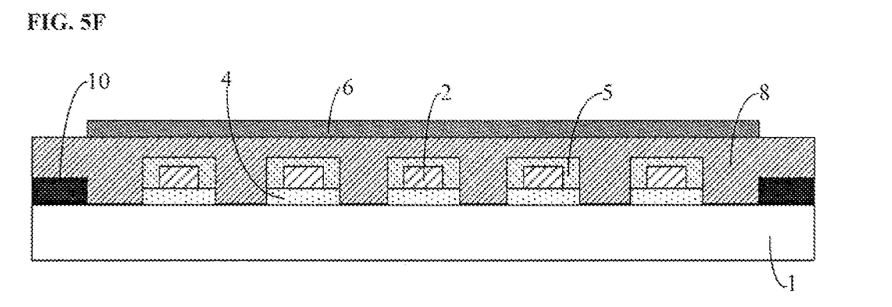

Referring to FIG. 5F, a third anti-reflective layer 6 is formed on a side of the first insulating layer 8 distal to the base substrate 1. Various appropriate methods may be used for making the third anti-reflective layer 6, e.g., using a lithography process. Optionally the third anti-reflective layer 6 is formed by ink-jet printing an anti-reflective material.

Figure 5G:
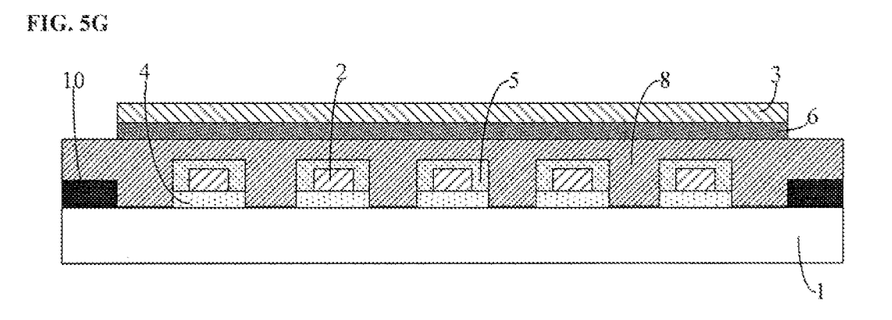

Referring to FIG. 5G, a second touch electrode layer is formed on a side of the third anti-reflective layer 6 distal to the base substrate 1. The step of forming the second touch electrode layer includes forming a plurality of second touch electrodes 3. Various appropriate methods may be used for making the plurality of second touch electrodes 3. e.g., using a lithography process. Optionally, the plurality of second touch electrodes 3 are formed by ink-jet printing a conductive material. Optionally, the ink-jet printing is a nano-printing process, e.g., an electrohydrodynamic inkjet (E-jet) printing process.

In some embodiments, the step of ink-jet printing the plurality of second touch electrodes 3 includes dispersing conductive nano-particles (e.g., metallic nano-particles) in an organic solvent, forming a plurality of nano-droplets by applying an electric field to the organic solvent, ink-jet printing the plurality of nano-droplets on a substrate through a nozzle having a small diameter (e.g., 1 μm) thereby forming a plurality of nanowires, and removing the organic solvent from the plurality of nanowires using a thermal annealing process, during which the conductive nano-particles in the plurality of nanowires sinter into the final touch electrodes. In one example, the conductive nano-particles are one or a combination of gold nano-particles, silver nano-particles, and copper nano-particles. Optionally, the thermal annealing process is performed at an annealing temperature in a range of approximately 100 degrees to approximately 350 degrees and for an annealing duration in a range of approximately 1 minute to approximately 60 minutes.

Optionally, the second touch electrode layer has a single layer structure. Optionally, the second touch electrode layer is formed to have a multi-layer structure, e.g., a laminated multi-layer structure. The multiple layers of the second touch electrode layer may be made of a same material. Optionally, at least two layers of the multiple layers of the second touch electrode layer are made of different materials.

Figure 5H:
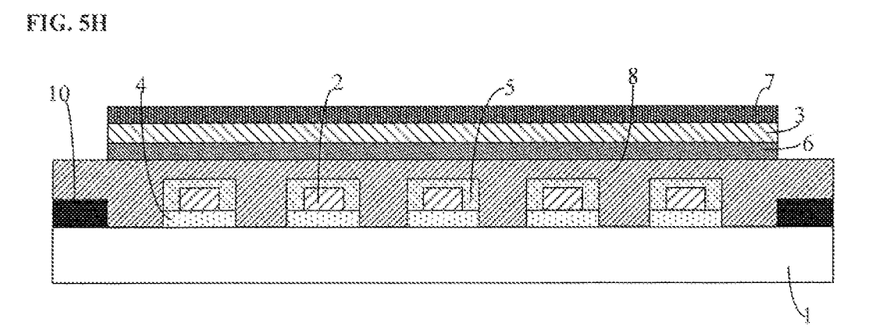

Referring to FIG. 5H, a fourth anti-reflective layer 7 is formed on a side of the second touch electrode layer distal to the base substrate 1. Various appropriate methods may be used for making the fourth anti-reflective layer 7. e.g., using a lithography process. Optionally the fourth anti-reflective layer 7 is formed by ink-jet printing an anti-reflective material. Optionally, the third anti-reflective layer 6 and the fourth anti-reflective layer 7 are formed so that orthographic projections of the third anti-reflective layer 6 and the fourth anti-reflective layer 7 on the base substrate 1 substantially cover an orthographic projection of each of the plurality of second touch electrodes 3. By having this design, the reflection of light on each of the plurality of second touch electrodes 3 can be significantly reduced, enhancing the blanking effect of the plurality of second touch electrodes 3.

Various appropriate methods may be used for making the third anti-reflective layer 6 and the fourth anti-reflective layer 7, e.g., using a lithography process. Optionally, the third anti-reflective layer 6 and the fourth anti-reflective layer 7 are formed by ink-jet printing an anti-reflective material. Optionally, the ink-jet printing is a nano-printing process, e.g., an electrohydrodynamic inkjet (E-jet) printing process. By forming the third anti-reflective layer 6 and the fourth anti-reflective layer 7 using a nano-printing process, damages to the plurality of second touch electrodes 3 occurring in an etch process typically associated with a lithography process can be completely avoided, ensuring a substantially uniform line width of the plurality of second touch electrodes 3.

In some embodiments, the step of ink-jet printing the third anti-reflective layer 6 or the fourth anti-reflective layer 7 includes dispersing nano-particles of an anti-reflective material (e.g., nano-particles of an oxide, a nitride, an oxynitride) in an organic solvent. Optionally, the dispersing step includes dispersing nano-particles of the anti-reflective material and a small amount of metallic nano-particles together in the organic solvent. The step of ink-jet printing the third anti-reflective layer 6 or the fourth anti-reflective layer 7 further includes forming a plurality of nano-droplets by applying an electric field to the organic solvent, ink-jet printing the plurality of nano-droplets on a substrate through a nozzle having a small diameter (e.g., 2 μm or 3 μm) thereby forming a plurality of anti-reflective nanowires, and removing the organic solvent from the plurality of anti-reflective nanowires using a thermal annealing process, during which the anti-reflective nano-particles in the plurality of anti-reflective nanowires sinter into the final anti-reflective layer. In one example, the anti-reflective nano-particles are nano-particles of one or a combination of an oxide, a nitride, an oxynitride, e.g., nano-particles of one or a combination of a metal oxide, a metal nitride, a metal oxynitride, an alloy oxide, an alloy nitride, and an alloy oxynitride. Optionally, the thermal annealing process is performed at an annealing temperature in a range of approximately 100 degrees to approximately 350 degrees and for an annealing duration in a range of approximately 1 minute to approximately 60 minutes.

Optionally, the step of ink-jet printing the plurality of nano-droplets on the base substrate includes ink-jet printing the plurality of nano-droplets on the first side of each of the plurality of second touch electrodes using a first nozzle; and ink-jet printing the plurality of nano-droplets on the second side of each of the plurality of second touch electrodes using a second nozzle. Optionally, the first nozzle and the second nozzle are a same nozzle. Optionally, the first nozzle has a first diameter; the second nozzle has a second diameter; and a ratio of the second diameter to the first diameter is in a range of approximately 2 to approximately 0.9. Optionally, the second diameter is approximately 1.5 times the first diameter. Optionally, the second diameter is substantially the same as the first diameter. Optionally, the second diameter is 3 μm, and the first diameter is 2 μm.

In some embodiments, the anti-reflective material nano-particles solution for printing the fourth anti-reflective layer 7 has a concentration of the anti-reflective nano-particles lower than the concentration in the solution for printing the third anti-reflective layer 6, e.g., lower by 10% to 40%. As a result, the fourth anti-reflective layer 7 is formed to have a fourth coating thickness over the fifth side S5 of one of the plurality of second touch electrodes 3, the third anti-reflective layer 6 is formed to have a third coating thickness over the fourth side S4 of one of the plurality of second touch electrodes 3, the fourth coating thickness being smaller than the third thickness, achieving an enhanced anti-reflective result.

Referring to FIG. 1, a second insulating layer 9 is formed on a side of the fourth anti-reflective layer 7 distal to the base substrate 1. Optionally, the second insulating layer 9 includes an organic insulating material. Optionally, the second insulating layer 9 covers the entire surface of the base substrate 1.

In another aspect, the present disclosure further provides a touch control display apparatus having a touch substrate described herein or fabricated by a method described herein. Examples of appropriate touch control display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch substrate, comprising:
a base substrate;
a first touch electrode layer on the base substrate and comprising a plurality of first touch electrodes; and
a first anti-reflective coating;
wherein the plurality of first touch electrodes comprises a plurality of first nanowire touch electrodes;
wherein the first anti-reflective coating comprises:
a first anti-reflective layer isolating at least a portion of a respective one of the plurality of first nanowire touch electrodes from the base substrate; and
a second anti-reflective layer on top of the first anti-reflective layer and the portion of the respective one of the plurality of first nanowire touch electrodes.

2. The touch substrate of claim 1, wherein
an orthographic projection of the second anti-reflective layer on the base substrate cover an orthographic projection of the portion of the respective one of the plurality of first nanowire touch electrodes on the base substrate.

3. The touch substrate of claim 1, wherein an orthographic projection of the first anti-reflective layer on the base substrate cover the orthographic projection of the portion of the respective one of the plurality of first nanowire touch electrodes on the base substrate.

4. The touch substrate of claim 1,
wherein, in a cross-section along a plane perpendicular to an extension direction of the respective one of the plurality of first nanowire touch electrodes, the second anti-reflective layer has a bridge structure in contact with a top side and lateral sides of the portion of the respective one of the plurality of first nanowire touch electrodes, the second anti-reflective layer is in contact with the first anti-reflective layer, and the first anti-reflective layer is in contact with a bottom side of the portion of the respective one of the plurality of first nanowire touch electrodes.

5. The touch substrate of claim 4, wherein, in the cross-section, a periphery of the portion of the respective one of the plurality of first nanowire touch electrodes is enclosed by the first anti-reflective layer and the second anti-reflective layer.

6. The touch substrate of claim 1,
the first anti-reflective layer comprises a plurality of first anti-reflective nanowires;
a respective one of the plurality of first anti-reflective nanowires isolates the portion of a respective one of the plurality of first nanowire touch electrodes from the base sub state;
the second anti-reflective layer comprises a plurality of second anti-reflective nanowires; and
a respective one of the plurality of second anti-reflective nanowires is on top of the first anti-reflective layer and the portion of the respective one of the plurality of first nanowire touch electrodes.

7. The touch substrate of claim 6, wherein the respective one of the plurality of first nanowire touch electrodes has a line width in a range of approximately 0.1 nm to approximately 100 nm;
the respective one of the plurality of first anti-reflective nanowires has a line width in a range of approximately 0.12 nm to approximately 150 nm; and
the respective one of the plurality of second anti-reflective nanowires has a line width in a range of approximately 0.132 nm to approximately 210 nm.

8. The touch substrate of claim 7, wherein the respective one of the plurality of first nanowire touch electrodes has a thickness in a range of approximately 0.4 nm to approximately 400 nm.

9. The touch substrate of claim 6, wherein the respective one of the plurality of second anti-reflective nanowires has a second coating thickness in a region where the respective one of the plurality of second anti-reflective nanowires is in contact with the portion of the respective one of the plurality of first nanowire touch electrodes;
the respective one of the plurality of first anti-reflective nanowires has a first coating thickness in a region where the respective one of the plurality of first anti-reflective nanowires is in contact with the portion of the respective one of the plurality of first nanowire touch electrodes; and
the second coating thickness is smaller than the first coating thickness.

10. The touch substrate of claim 1, further comprising:
a second touch electrode layer on the base substrate and comprising a plurality of second touch electrodes; and
a second anti-reflective coating;
wherein the plurality of second touch electrodes comprises a plurality of second nanowire touch electrodes;
wherein the second anti-reflective coating comprises:
a third anti-reflective layer isolating at least a portion of a respective one of the plurality of second nanowire touch electrodes from the base substrate; and
a fourth anti-reflective layer on top of the third anti-reflective layer and the portion of the respective one of the plurality of second nanowire touch electrodes.

11. The touch substrate of claim 10, wherein
an orthographic projection of the fourth anti-reflective layer on the base substrate cover an orthographic projection of the portion of the respective one of the plurality of second nanowire touch electrodes on the base substrate.

12. The touch substrate of claim 11, wherein an orthographic projection of the third anti-reflective layer on the base substrate cover the orthographic projection of the portion of the respective one of the plurality of second nanowire touch electrodes on the base substrate.

13. The touch substrate of claim 10,
wherein, in a cross-section along a plane perpendicular to an extension direction of the respective one of the plurality of second nanowire touch electrodes, the fourth anti-reflective layer has a bridge structure in contact with a top side and lateral sides of the portion of the respective one of the plurality of second nanowire touch electrodes, the fourth anti-reflective layer is in contact with the third anti-reflective layer, and the third anti-reflective layer is in contact with a bottom side of the portion of the respective one of the plurality of second nanowire touch electrodes.

14. The touch substrate of claim 10,
the third anti-reflective layer comprises a plurality of third anti-reflective nanowires;

a respective one of the plurality of third anti-reflective nanowires isolates the portion of a respective one of the plurality of second nanowire touch electrodes from the base sub state;

the fourth anti-reflective layer comprises a plurality of fourth anti-reflective nanowires; and a respective one of the plurality of fourth anti-reflective nanowires is on top of the third anti-reflective layer and the portion of the respective one of the plurality of second nanowire touch electrodes.

15. The touch substrate of claim 14, wherein the respective one of the plurality of second nanowire touch electrodes has a line width in a range of approximately 0.1 nm to approximately 100 nm;

the respective one of the plurality of third anti-reflective nanowires has a line width in a range of approximately 0.12 nm to approximately 150 nm; and the respective one of the plurality of fourth anti-reflective nanowires has a line width in a range of approximately 0.132 nm to approximately 210 nm.

16. The touch substrate of claim 15, wherein the respective one of the plurality of second nanowire touch electrodes has a thickness in a range of approximately 0.4 nm to approximately 400 nm.

17. The touch substrate of claim 15, wherein the respective one of the plurality of fourth anti-reflective nanowires has a fourth coating thickness in a region where the respective one of the plurality of fourth anti-reflective nanowires is in contact with the portion of the respective one of the plurality of second nanowire touch electrodes;

the respective one of the plurality of third anti-reflective nanowires has a third coating thickness in a region where the respective one of the plurality of third anti-reflective nanowires is in contact with the portion of the respective one of the plurality of second nanowire touch electrodes; and the fourth coating thickness is smaller than the third thickness.

18. The touch substrate of claim 1, wherein the plurality of first touch electrodes comprises a plurality of first nanowire touch electrodes, each of which comprises a metallic nanowire.

19. The touch substrate of claim 1, wherein the first anti-reflective coating comprises one or a combination of a metal oxide, a metal nitride, a metal oxynitride, an alloy oxide, an alloy nitride, and an alloy oxynitride.

20. A touch control display apparatus, comprising the touch substrate of claim 1.

* * * * *